US011264541B2

(12) United States Patent
Ishida et al.

(10) Patent No.: US 11,264,541 B2
(45) Date of Patent: Mar. 1, 2022

(54) LIGHT EMITTING DEVICE AND METHOD OF MANUFACTURING THE LIGHT EMITTING DEVICE

(71) Applicant: NICHIA CORPORATION, Anan (JP)

(72) Inventors: Naoki Ishida, Anan (JP); Takuya Yamanoi, Tokushima (JP); Hirofumi Yoshida, Tokushima (JP)

(73) Assignee: NICHIA CORPORATION, Anan (JP)

( * ) Notice: Subject to any disclaimer, the term of this patent is extended or adjusted under 35 U.S.C. 154(b) by 118 days.

(21) Appl. No.: 16/811,965

(22) Filed: Mar. 6, 2020

(65) Prior Publication Data
US 2020/0287092 A1 Sep. 10, 2020

(30) Foreign Application Priority Data

Mar. 8, 2019 (JP) .............................. JP2019-043176

(51) Int. Cl.
| | |
|---|---|
| *H01L 33/44* | (2010.01) |
| *H01L 33/32* | (2010.01) |
| *H01L 33/00* | (2010.01) |
| *H01L 33/62* | (2010.01) |
| *H01L 33/48* | (2010.01) |
| *H01L 33/50* | (2010.01) |

(52) U.S. Cl.
CPC .......... *H01L 33/44* (2013.01); *H01L 33/0075* (2013.01); *H01L 33/32* (2013.01); *H01L 33/486* (2013.01); *H01L 33/507* (2013.01); *H01L 33/62* (2013.01); *H01L 2933/0025* (2013.01)

(58) Field of Classification Search
CPC ..... H01L 33/44; H01L 33/0075; H01L 33/32; H01L 33/483; H01L 33/486; H01L 33/507; H01L 33/62
See application file for complete search history.

(56) References Cited

U.S. PATENT DOCUMENTS 9,835,297 B2 * 12/2017 Kiyota ................ H01S 5/02345
10,811,581 B2 * 10/2020 Kozuru ................... H01L 33/50
(Continued)

FOREIGN PATENT DOCUMENTS

| JP | 5-48361 U | 6/1993 |
|---|---|---|
| JP | 2002-359314 A | 12/2002 |

(Continued)

*Primary Examiner* — Savitri Mulpuri
(74) *Attorney, Agent, or Firm* — Birch, Stewart, Kolasch & Birch, LLP

(57) ABSTRACT

A light emitting device includes a package having an upper surface and an upward-opening recess defined in a portion of the upper surface, at least one light-emitting element in the recess, a light-transmissive member covering the opening of the recess, and an antireflection film on a lower surface of the light-transmissive member, the antireflection film located between the lower surface of the light-transmissive member and an upper surface of the package at a location where a portion of the lower surface of the light-transmissive member is bonded to the upper surface of the package via the antireflection film. A coating film is disposed on at least a portion of an outer surfaces of the light emitting device, the portion including a region where the antireflection film located between the lower surface of the light-transmissive member and the upper surface of the package is exposed.

5 Claims, 8 Drawing Sheets

(56) References Cited

U.S. PATENT DOCUMENTS

| | | | |
|---|---|---|---|
| 2007/0019101 A1* | 1/2007 | Minamio | H01L 27/14632 348/335 |
| 2009/0261708 A1* | 10/2009 | Moseri | H01L 33/56 313/501 |
| 2011/0109713 A1* | 5/2011 | Yamaguchi | G02B 26/10 347/224 |
| 2014/0369052 A1 | 12/2014 | Oshima et al. | |
| 2016/0181479 A1* | 6/2016 | Kim | H01L 33/58 257/98 |
| 2018/0108813 A1 | 4/2018 | Oshima et al. | |
| 2019/0088824 A1* | 3/2019 | Kim | H01L 33/507 |
| 2019/0096778 A1 | 3/2019 | Oka et al. | |
| 2019/0103517 A1* | 4/2019 | Kim | H01L 33/486 |
| 2019/0245117 A1* | 8/2019 | Kim | H01L 33/486 |
| 2020/0194968 A1* | 6/2020 | Hashimoto | H01S 5/02255 |
| 2021/0013378 A1* | 1/2021 | Lee | H01L 33/502 |

FOREIGN PATENT DOCUMENTS

| | | |
|---|---|---|
| JP | 2006-322916 A | 11/2006 |
| JP | 2015-2319 A | 1/2015 |
| JP | 2017-73489 A | 4/2017 |
| JP | 2018-6456 A | 1/2018 |

* cited by examiner

LIGHT EMITTING DEVICE AND METHOD OF MANUFACTURING THE LIGHT EMITTING DEVICE

CROSS-REFERENCE TO RELATED PATENT APPLICATION

The present application claims priority under 35 U. S. C. § 119 to Japanese Patent Application No. 2019-043176, filed Mar. 8, 2019, the contents of which are incorporated herein by reference in its entirety.

BACKGROUND OF THE INVENTION

1. Field of the Invention

The present disclosure relates to a light emitting device and a method of manufacturing the light emitting device.

2. Description of Related Art

There has been proposed a light emitting device that includes a light emitting element disposed in an upward-opening recess of a package, and a light-transmissive member sealing the opening of the recess (see, for example, JP2018-6456 A). In another proposal, the opening of such a recess is sealed by a holding member defining an opening and the opening of the holding member is sealed by a light-transmissive member (see, for example, JP2017-73489 A). JP2017-73489 A illustrates a light emitting device in which an antireflection film is disposed on a surface of the light-transmissive member, and between the light-transmissive member and the holding member.

SUMMARY OF THE INVENTION

Further improvement in reliability of the light emitting device has been required.

The present disclosure includes embodiments given below.

A light emitting device includes: a package having an upper surface and an upward-opening recess defined in a portion of the upper surface; at least one light-emitting element disposed in the recess; a light-transmissive member covering an opening of the recess, an antireflection film disposed on a lower surface of the light-transmissive member with portions of the antireflection film located between the lower surface of the light-transmissive member and an upper surface of the package at a location where a portion of the lower surface of the light-transmissive member is bonded to the upper surface of the package via the antireflection film; and a coating film disposed on at least a portion of outer surfaces of the light emitting device, the portion including a region where the antireflection film between the lower surface of the light-transmissive member and the upper surface of the package is exposed to environmental air.

A light emitting device includes: a package having an upward-opening recess; at least one light-emitting element disposed in the recess; a holding member defining an opening disposed at an upper surface side of the package and partially covering an opening of the recess; a light-transmissive member having a lower surface and covering the opening defined by the holding member, an antireflection film disposed on the lower surface of the light-transmissive member, the antireflection film located between the lower surface of the light-transmissive member and an upper surface of the holding member at a location where a portion of the lower surface of the light-transmissive member is bonded to the upper surface of the holding member via the antireflection film; and a coating film disposed on at least a portion of outer surfaces of the light emitting device, the portion including a region where the antireflection film between the lower surface of the light-transmissive member and the upper surface of the holding member is exposed to environmental air.

A method of manufacturing a light emitting device, the method includes: providing a light-emitting element package, the light-emitting element package including; a package having an upper surface, a portion of the upper surface defining an upward-opening recess; at least one light-emitting element disposed in the recess; a light-transmissive member having a lower surface, a portion of the lower surface being bonded to the upper surface of the package and covering the opening of the recess; and an antireflection film disposed on the lower surface of the light-transmissive member and located between the lower surface of the light-transmissive member and the upper surface of the package at a location where a portion of the lower surface of the light-transmissive member is bonded to the upper surface of the package; and disposing a coating film on at least a portion of outer surfaces of the light-emitting element package, the portion including a region where the antireflection film located between the lower surface of the light-transmissive member and the upper surface of the package is exposed.

A method of manufacturing a light emitting device, the method includes: providing a light-emitting element package, the light-emitting element package including; a package having an upward-opening recess; at least one light-emitting element disposed in the recess; a holding member defining an opening disposed at an upper surface side of the package and partially covering an opening of the recess; a light-transmissive member covering the opening of the holding member; and an antireflection film disposed on a lower surface of the light-transmissive member, the antireflection film located between the lower surface of the light-transmissive member and an upper surface of the package at a location where a portion of the lower surface of the light-transmissive member is bonded to the upper surface of the package via the antireflection film; and disposing a coating film on at least a portion of outer surfaces of the light-emitting element package, the portion including a region where the antireflection film located between the lower surface of the light-transmissive member and the upper surface of the holding member is exposed to environmental air.

According to certain embodiments of the present disclosure, a light emitting device with good reliability can be provided. Further, according to certain embodiments of the present disclosure, such a light emitting device with good reliability can be easily manufactured.

DESCRIPTION OF THE EMBODIMENTS

Certain embodiments of the present disclosure will be described below with reference to the drawings. The embodiments below are intended as illustrative and the present disclosure is not limited to those described below. In the description below, terms which indicate specific directions or locations (for example, "up", "down" and other terms expressing those) may be applied. Those terms are used to express relative directional relationship and positional relationship between the components in a drawing which is referred to for the ease of understanding. The sizes and the arrangement relationship of the components in each of drawings are occasionally shown exaggerated for ease of understanding, and may not represent actual dimensions or dimensional relationships between the components. Also, for the sake of easy understanding, illustration of one or more components may be appropriately omitted in some drawings.

Light Emitting Device 1 According to First Embodiment

Figure 1A:
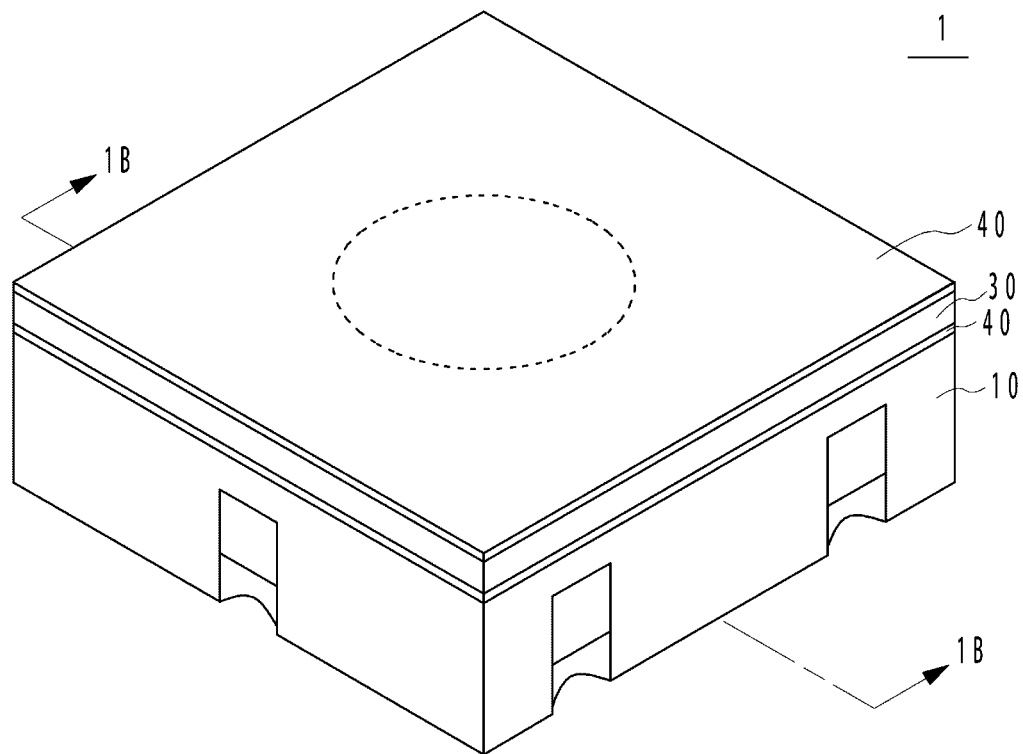
FIG. 1A is a schematic perspective view illustrating a light-emitting device according to a first embodiment.
Figure 1B:
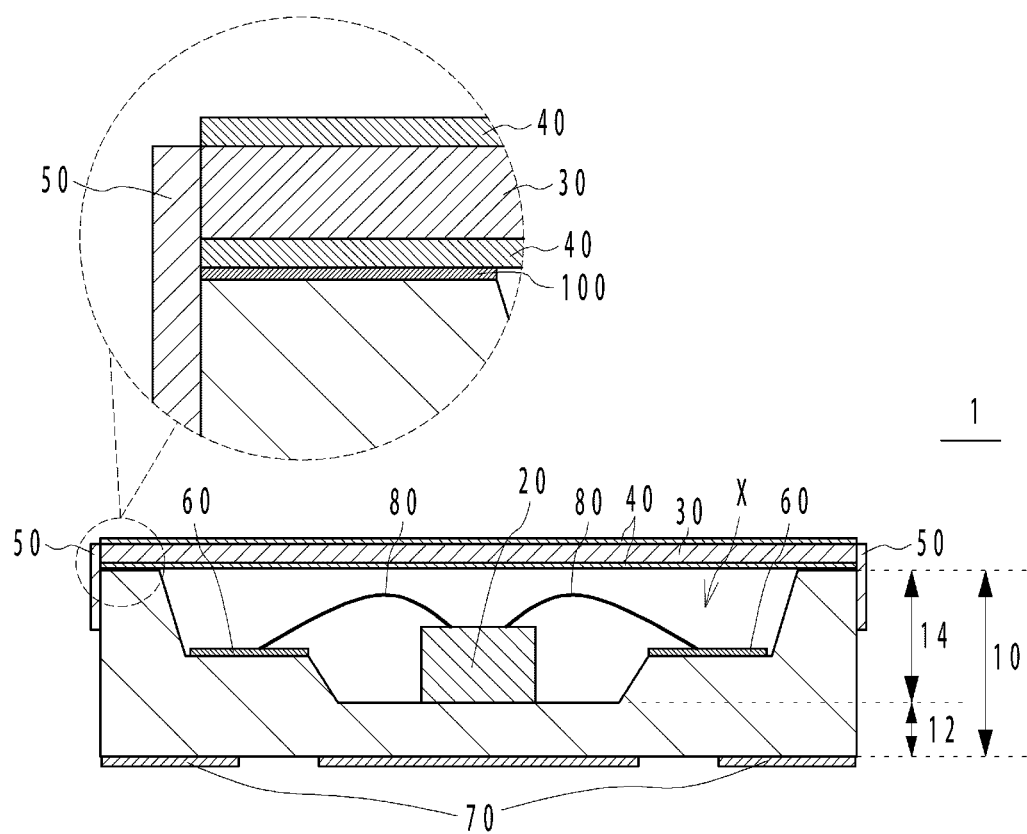
FIG. 1B is a schematic cross-sectional view taken along 1B-1B in FIG. 1A.

FIG. 1A is a schematic perspective view of a light emitting device according to a first embodiment, and FIG. 1B is a schematic cross-sectional view taken along line 1B-1B in FIG. 1A. In FIG. 1A, for the sake of easy understanding, a coating film is not shown. As shown in FIG. 1A and FIG. 1B, a light emitting device includes: a package 10 having an upper surface and an upward-opening recess X defined in a portion of the upper surface; at least one light-emitting element 20 disposed in the recess X; a light-transmissive member covering the opening of the recess; and an antireflection film 40 disposed on a lower surface of the light-transmissive member 30, the antireflection film 40 located between the lower surface of the light-transmissive member 30 and an upper surface of the package 10 at a location where a portion of the lower surface of the light-transmissive member 30 is bonded to the upper surface of the package 10 via the antireflection film 40, in which a coating film 50 is disposed on at least a portion of an outer surfaces of the light emitting device 1, the portion including a region where the antireflection film 40 between the lower surface of the light-transmissive member 30 and the upper surface of the package 10 is exposed. Each component will be described below.

Package 10

The package 10 is configured to house the at least one light-emitting element 20. The package 10 has an upper surface and an upward-opening recess is formed in a portion of the upper surface. The opening of the recess X is, for example, circular in a top view. The package 10 may include a base portion 12 having a plate-like shape and a wall portion 14. The upper surface of the base portion 12 includes a portion defining the upward-facing surface of the recess X and the upper surface of the wall portion 14 serves the upper surface of the package 10. The base portion 12 and the wall portion 14 may be formed integrally by injection molding or the like, or may be bonded using an adhesive material.

Examples of the material of the package 10 (for example, the base portion 12, the wall portion 14) include electrically insulating materials such as glass epoxy, resin, or ceramics. When employing ceramics, ceramics having high heat-resisting properties and high weather resistant properties are preferable. Examples of such ceramics include alumina, aluminum nitride, and mullite. The package 10 may include ceramics and an electrically insulating layer made of an electrically insulating material other than ceramics. Examples of such electrically insulating materials include BT resin, glass epoxy, and epoxy-based resin.

The package 10 may be formed by insert molding, by which an electrically conductive member and a resin material are formed in a single piece. The electrically conductive member can be, for example, lead electrodes, portions of which can be used as wiring electrodes 60 or external electrodes 70. Examples of the resin material include thermoplastic resin, thermosetting resin, and the like, which are more specifically, resins such as polyphthalamide (PPA), polycarbonate resin, polyphenylene sulfide (PPS), liquid crystal polymer (LCP), acrylonitrile-butadiene-styrene (ABS) resin, epoxy resin, phenol resin, acrylic resin, and polybutylene terephthalate (PBT) resin.

Light Emitting Element 20

At least one light emitting element 20 is disposed in the recess X. For the light-emitting element 20, a light-emitting diode, a semiconductor laser element, or the like can be used, and particularly, a semiconductor laser element can be preferably used.

The light-emitting element 20 including a nitride semiconductor typically represented by $In_XAl_YGa_{1-X-Y}N(0 \leq X, 0 \leq Y, X+Y \leq 1)$ is preferably used. The light-emitting element having an emission wavelength in a range from deep ultraviolet to ultraviolet may be used in which the light emitting element has a semiconductor layered structure preferably including a nitride semiconductor layer containing at least aluminum. The light emitting element 20 at least has a semiconductor layered structure and may optionally have a substrate (a growth substrate used for growing the semiconductor layers) on which the semiconductor layered structure is disposed. Examples of such a substrate include an electrically insulating substrate such as sapphire and spinel $(MgAl_2O_4)$, silicon nitride (6H, 4H, 3C), silicon, ZnS, ZnO, GaAs, diamond, an oxide substrate such as lithium niobate and neodymium gallate, and a nitride semiconductor substrate (such as GaN and AlN). The semiconductor layered structure can be, for example, a homo structure, a hetero structure, or a double hetero structure, having a MIS junction, or a PIN junction. The semiconductor active layer may have a single quantum well structure or a multiquantum well structure, in which thin layers each can produce quantum effect are layered. The active layer may be doped with a donor dopant such as Si or Ge and/or an acceptor dopant such as Zn or Mg.

Light emitting elements using nitride semiconductors typically represented by $In_XAl_YGa_{1-X-Y}N(0 \leq X, 0 \leq Y, X+Y \leq 1)$ are known to have various peak emission wavelengths, and from those, the peak wavelength of the light emitting element 20 can be appropriately selected. The light emitting element 20 preferably has a peak emission wavelength in a range of 250 nm to 410 nm.

The light emitting element 20 is electrically connected to the wiring electrodes 60, for example, through wires 80. In the present embodiment, positive and negative electrodes of the light-emitting element 20 are respectively electrically connected to the wiring electrodes 60 via wires 80, but either one of the positive and negative electrodes may be electrically connected to a corresponding one of the wiring electrode via a wire and the other of the electrode may be electrically connected to a corresponding one of the wiring electrode by die-bonding. The light-emitting element may be connected to the wiring electrodes in a flip chip manner.

Light-Transmissive Member 30

The light-transmissive member 30 is configured to hermetically seal the recess X. A portion of the lower surface of the light-transmissive member 30 is bonded to the upper surface of the package 10 to cover the opening of the recess X via the antireflection film 40. The light-transmissive member 30 and the package 10 can be bonded using an adhesive material 100 or using AuSn. Examples of the material of the adhesive material 100 include at least one selected from an epoxy resin, a silicone resin, a polyimide resin, a polyamide resin, a fluorine-based elastomer, glass, a eutectic material (such as Au—Sn) containing at least one selected from Au, Ag, Bi, Cu, In, Pb, Sn, and Zn, a hot-melt resin, a modified silicone, and an organic-inorganic hybrid resin.

The light-transmissive member 30 is configured to transmit light from the light-emitting element 20 disposed in the recess X of the package 10 to emit light to the outside of the light-emitting device 1. Examples of the material having such a function include an inorganic material containing at least one selected from the group consisting of borosilicate glass, quartz glass, sapphire glass, calcium fluoride glass, aluminoborosilicate glass, oxynitride glass, and chalcogenide-based glass. It is preferable that borosilicate glass is used for the light-transmissive member 30, because borosilicate glass has high light-resisting properties.

The light-transmissive member 30 may have a flat plate-like shape, or a downwardly concave shape toward the recess of the package. Alternatively, the light-transmissive member 30 may have a lens shape with positively spherical or positively aspherical surfaces toward and away from the recess of the package. The thickness of the light-transmissive member 30 may be, for example, in a range of 1 mm to 7 mm.

Antireflection Film 40

The antireflection film 40 is configured such that light emitted from the light-emitting element 20 and light emitted from the light-emitting element 20 further reflected within the recess X are efficiently emitted to the outside of the light-emitting device. The antireflection film 40 may also be referred to as an AR coated layer, an AR film, or the like. The term "AR" is an abbreviation for antireflection.

For the antireflection film 40, a dielectric multilayer film or a metal film can be used. For the dielectric multilayer film can be formed by alternatingly layering at least two films selected from $Al_2O_3$, $SiO_2$, $Ta_2O_5$, $MgF_2$, $HfO_2$, $ZrO_2$, $TiO_2$, and $Nb_2O_5$. The antireflection film 40 may include minute defects. Even when the antireflection film 40 includes minute defects, according the present embodiment, unintended substances contained in environmental air can be prevented from entering the recess X of the package through the minute defects in the antireflection film 40 by the coating film 50.

The antireflection film 40 is disposed above the recess X of the package 10 and extended outward such that at least light from the lower surface side of the light-transmissive member 30, more specifically light from the recess X can be efficiently emitted to the outside. In order to further improve efficiency, in addition to the lower surface of the light-transmissive member 30, the antireflection film 40 may be disposed on the upper surface of the light-transmissive member 30. The antireflection film 40 can be disposed directly or indirectly via another member to the lower surface, or to both the lower surface and the upper surface of the light-transmissive member 30.

The antireflection film 40 is present between the lower surface of the light-transmissive member 30 and the upper surface of the package 10 in a region where a portion of the lower surface of the light-transmissive member 30 is bonded to the upper surface of the package 10 via the antireflection film 40. When the antireflection film 40 is present in the region, and when the antireflection film 40 has minute defects, unintended substances contained in environmental air may enter the recess X of the package 10 through the defects. However, according to the present embodiment, an exposed surface of the antireflection film 40 is covered by the coating film 50, and therefore such entering can be prevented.

The antireflection film 40 has a thickness, for example, in a range of 0.5 µm to 2 µm.

Coating Film 50

The coating film 50 is configured to reduce or prevent entering of unintended substances contained in environmental air into the recess X of the package 10 through the minute faults in the antireflection film 40. The coating film 50 covering at least a portion of the outer surfaces of the light-emitting device 1 allows maintaining airtightness in the recess X of the package 10, which can reduce or prevent separation of the light-transmissive member 30 from the package 10. Of the outer surfaces of the light-emitting device 1, at least a portion covered by the coating film 50 includes a region exposing a portion of the antireflection film 40 present between the lower surface of the light-transmissive member 30 and the upper surface of the package 10. In the present specification, the expression "a region exposing a portion of the antireflection film 40" refers to a region of the antireflection film 40 which would be exposed to the environmental air unless the presence of the coating film 50. In other words, the coating film 50 is a member preventing the antireflection film 40 from being exposed to environmental air.

Figure 1C:
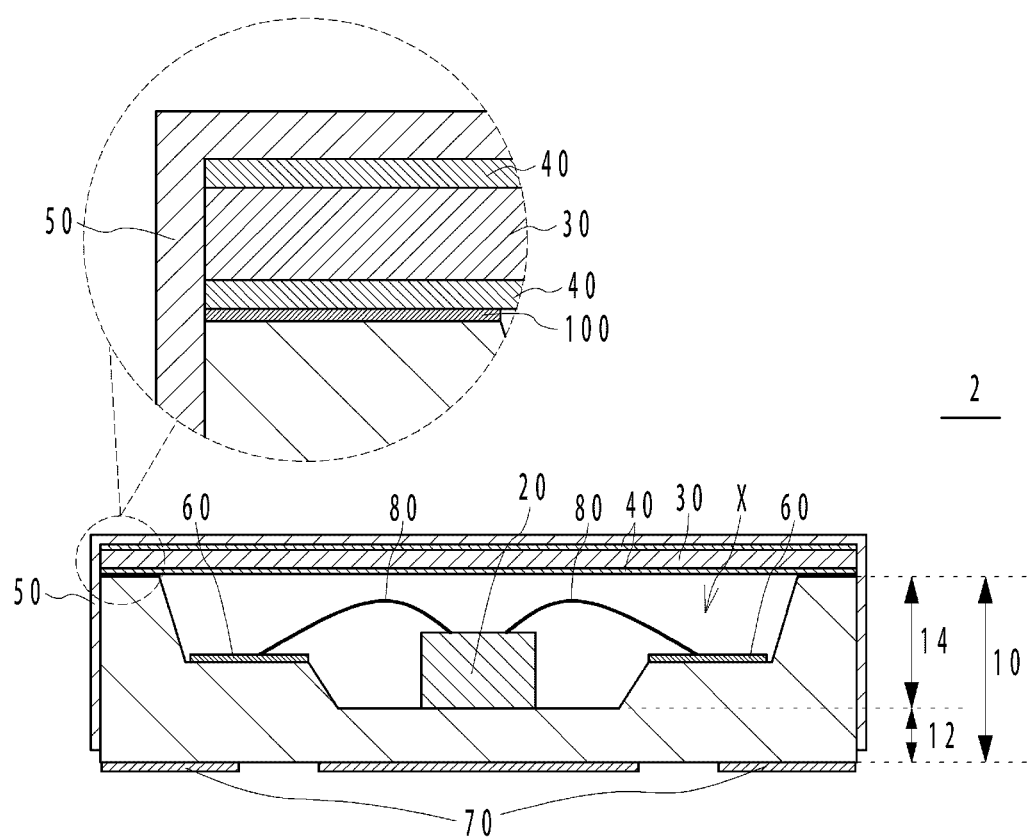
FIG. 1C is a schematic cross-sectional view illustrating another example of a coating film.

As shown in FIG. 1B, the coating film 50 may be disposed to cover a portion of the outer surfaces of the light-emitting device 1, but as shown in FIG. 1C, preferably disposed to cover substantially entire outer surfaces except for the lower surface of the light-emitting device 2. With this arrangement, the tendency of the coating film 50 separating from the outer surfaces of the light-emitting device 2 can be reduced or prevented.

The coating film 50 preferably containing aluminum oxide or silicon dioxide as its main component. More specifically, a film having layers of films containing aluminum oxide and silicon dioxide as respective main component, a film having alternatively layered films respectively containing aluminum oxide or silicon dioxide as its main component, or the like can be preferably used. The coating film 50 has a thickness of, for example, in a range of 3 nm to 250 nm. The coating film 50 can be disposed such that outer surfaces of the coating film 50 are exposed to environmental air. Meanwhile, the coating film 50 can be disposed such that inner surfaces of the coating film 50 are in contact with the outer surfaces of the light-emitting devices 1 and 2.

Wiring Electrodes 60, External Electrodes 70

The wiring electrodes 60 and the external electrodes 70 are respectively parts of respective electrically conductive members (for example, lead electrodes), and are respectively electrically connected to each other. That is, for example, each one of two electrically conductive members includes a region serving as a corresponding wiring electrode 60 and a different region serving as a corresponding external electrode 70. The light emitting element 20 is electrically connected to the external electrodes 70 via the wiring electrodes 60 respectively.

When the antireflection film used in a conventional light emitting device has minute defects, unintended substances such as moisture contained in the environmental air may gradually enter the recess of the package, the progress of the entering may result in decrease in airtightness, which may lead the light-transmissive member to detach from the package or a holding member.

In contrast, in the light emitting device 1 according to the first embodiment, at least portions of the outer surfaces, which include the regions where the antireflection film 40 between the lower surface of the light-transmissive member 30 and the upper surface of the package 10 are exposed, of the light emitting device 1 are covered by the coating film 50, such that the unintended substances contained in the environmental air can be impeded from entering into the recess X of the package 10 through the minute defects in the antireflection film 40. Accordingly, a light emitting device 1 in which occurrence of detachment of the light-transmissive member 30 is reduced or prevented, and has high reliability can be provided. Further, when at least portions of the outer surfaces of the light emitting device 1 include not only the regions where the antireflection film 40 between the lower surface of the light-transmissive member 30 and the upper surface of the package 10 are exposed, but also other regions (for example, where an adhesive material 100 is exposed to environmental air), entering of such unintended substances into the recess X of the package 10 through such regions can also be reduced or prevented.

Method of Manufacturing Light Emitting Device 1 According to First Embodiment

FIG. 2 is a schematic cross-sectional view illustrating a method of manufacturing a light emitting device according to the first embodiment. With reference to FIG. 2, an example of a method of manufacturing a light emitting device 1 according to the first embodiment will be described below.

Providing Light-Emitting Element Package 200

Figure 2A:
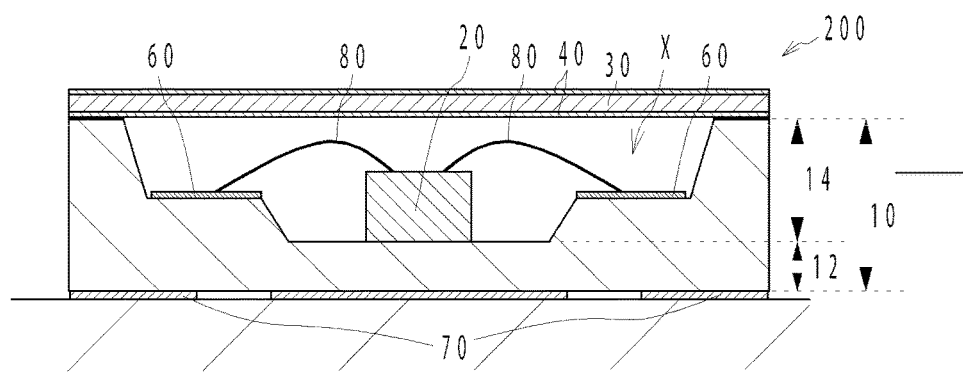
FIGS. 2(A) to 2(C) are schematic cross-sectional views illustrating a method of manufacturing a light emitting device according to the first embodiment.

As shown in FIG. 2A, a light-emitting element package 200 is provided. The light-emitting element package 200 includes: a package 10 having an upper surface and an upward-opening recess X defined in a portion of the upper surface; at least one light-emitting element 20 disposed in the recess X; a light-transmissive member 30 covering the opening of the recess X, and an antireflection film 40 disposed on a lower surface of the light-transmissive member 30, the antireflection film 40 located between the lower surface of the light-transmissive member 30 and an upper surface of the package 10 at a location where a portion of the lower surface of the light-transmissive member 30 is bonded to the upper surface of the package 10 via the antireflection film 40. The providing the light-emitting element package 200 may be performed by arranging the light-emitting element package 200 in a reaction chamber or the like, or by manufacturing the light-emitting element package 200 in a reaction chamber.

Providing Coating Film 50

Figure 2B:
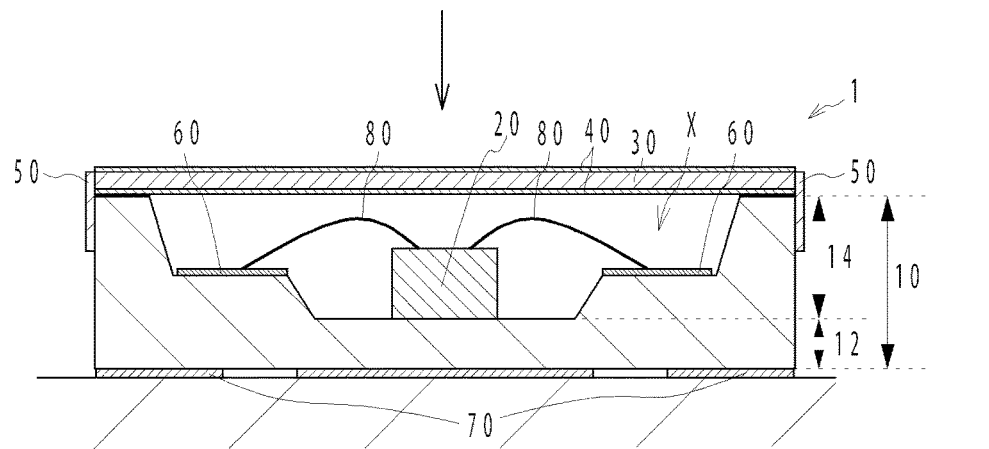
Figure 2C:
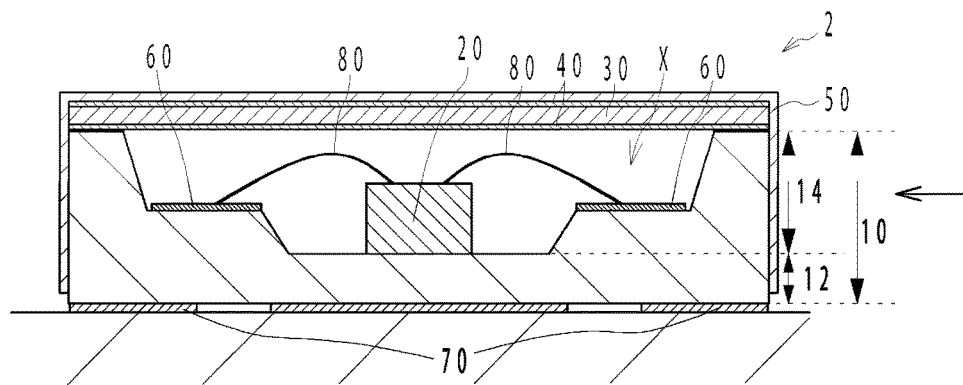

As shown in FIG. 2B, a coating film 50 is formed to cover at least a portion of the outer surfaces of the light-emitting element package 200, including the regions where the antireflection film 40 between the lower surface of the light-transmissive member 30 and the upper surface of the package 10 is exposed. The coating film 50 may be disposed to cover a portion of the outer surfaces of the light-emitting element package 200 as shown in FIG. 2B, but preferably disposed to cover substantially entire outer surfaces except for the lower surface of the light-emitting device 1 as shown in FIG. 2C. When the coating film 50 is disposed to cover at least a portion of the outer surfaces of the light-emitting element package 200, the rest of the portions of the outer surfaces of the light-emitting element package 200 is needed to be masked. However, when the coating film 50 is disposed to cover the substantially entire outer surfaces of the light-emitting element package 200, except for the lower surface of the light-emitting element package 200, such an operation to provide such a mask can be eliminated, which can further facilitate manufacturing of the light-emitting device 1 according to the first embodiment. The reason of the coating film 50 not to be disposed on the lower surface of the light emitting device 1 is that the light emitting device 1 is placed in the chamber with the lower surface of the light emitting device 1 in contact with a base mount in the reaction chamber or the like.

The coating film 50 can be formed using a thin-film forming method. Examples of such a thin-film forming method include a chemical vapor deposition method (CVD method) and a sputtering method. In particular, in order to increase the density of the coating film 50, an atomic layer deposition (ALD) method can be suitably used. The use of an ALD method allows for disposing the coating film 50 with high density, through which unintended substances contained in environmental air are not transmitted.

Next, as the coating film 50, disposing an aluminum oxide film using an ALD method will be illustrated. First, $H_2O$ gas is introduced in a chamber to introduce OH-groups on the entire or substantially entire outer surfaces of the light emitting device 1 except for the lower surface of the light emitting device 1. Excess gas is evacuated and trimethyl-aluminum (TMA) gas is introduced in the reaction chamber to allow OH groups react with TMA (first reaction). Then, $H_2O$ gas is introduced in the reaction chamber to allow TMA bonded to OH group react with $H_2O$ (second reaction). Excess gas is evacuated and the first reaction and the second reaction are repeated to form a dense aluminum oxide film with an intended thickness.

With the method described above, the light-emitting device 1 according to the first embodiment can be manufactured easily. An example of the method of manufacturing the light-emitting device 1 according to the first embodiment has been illustrated above, but other appropriate methods may also be employed.

Light Emitting Device 2 According to Second Embodiment

Figure 3A:
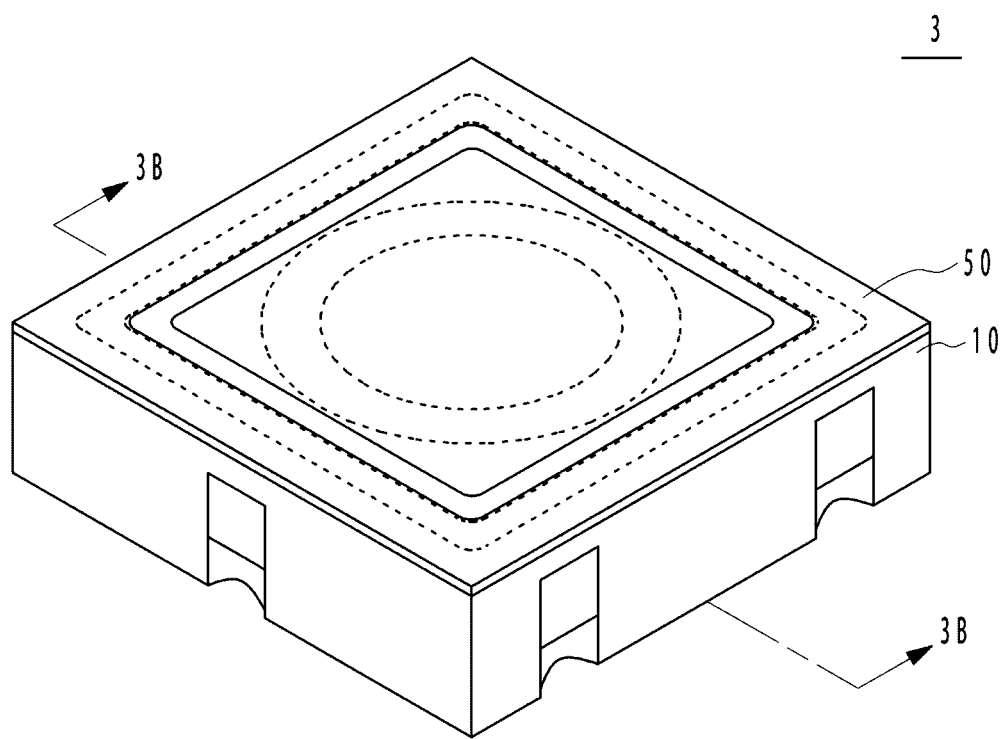
FIG. 3A is a schematic perspective view illustrating a light emitting device according to a second embodiment.
Figure 3B:
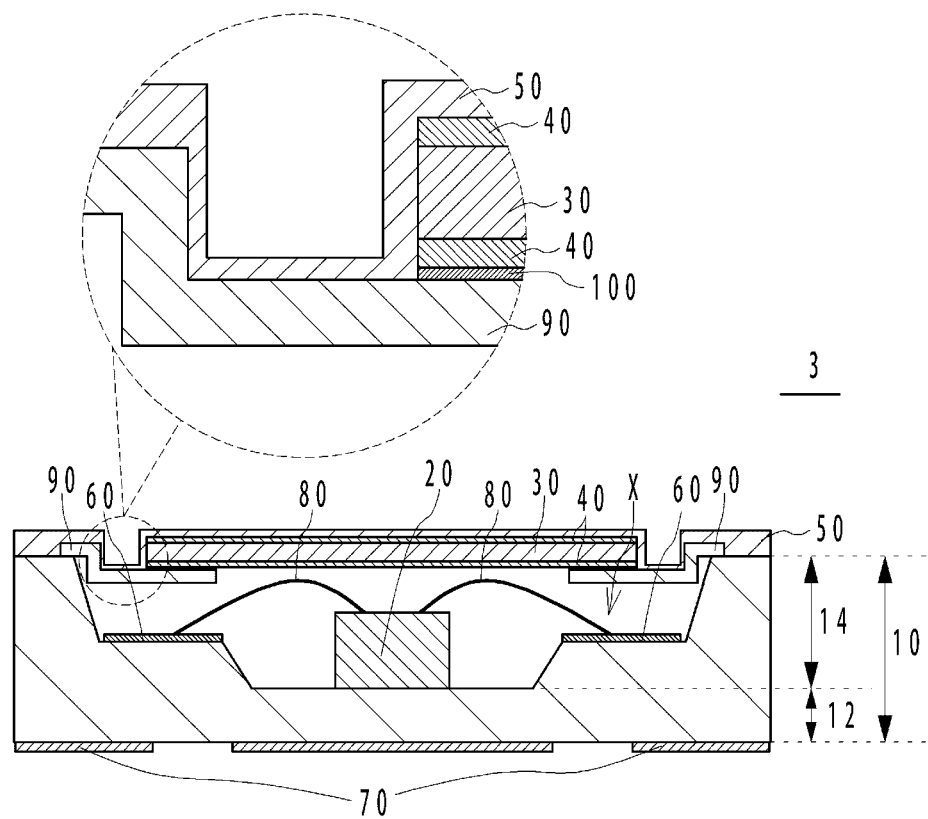
FIG. 3B is a schematic cross-sectional view taken along line 3B-3B in FIG. 3A.

FIG. 3A is a schematic perspective view of a light emitting device 3 according to a second embodiment, and FIG. 3B is a schematic cross-sectional view taken along line 2B-2B in FIG. 3A. As shown in FIG. 3A and FIG. 3B, a light emitting device 2 according to the second embodiment includes: a package 10 having an upper surface and an upward-opening recess X defined in a portion of the upper surface; at least one light-emitting element 20 disposed in the recess X; a light-transmissive member covering the opening of the recess; and an antireflection film 40 disposed on a lower surface of the light-transmissive member 30, the antireflection film 40 located between the lower surface of the light-transmissive member 30 and an upper surface of the package 10 at a location where a portion of the lower surface of the light-transmissive member 30 is bonded to the upper surface of the package 10 via the antireflection film 40, in which a coating film 50 is disposed on at least a portion of an outer surfaces of the light emitting device 3, the portion including a region where the antireflection film 40 between the lower surface of the light-transmissive member 30 and the upper surface of the package 10 is exposed. Each constituent member will be described in detail below.

Holding Member 90

The holding member 90 is configured to hold the light-transmissive member 30. The holding member 90 is disposed at an upper surface side of the package 10 and partially covers the opening of the recess X of the package 10. The holding member 90 defines an opening. For example, the holding member 90 is formed with a recess X and an opening is defined in an upward-facing surface of the recess X. The opening of the holding member 90 is covered by the light-transmissive member 30. The holding member 90 is bonded to the upper surface of the package 10 by, for example, welding. The light-transmissive member 30 is bonded to the holding member 90 by, for example, thermal welding.

Examples of the material of the holding member 90 include nickel-iron alloys such as kovar (iron-nickel-cobalt alloy), nickel-iron alloy, and invar. Kovar having a thermal expanding coefficient equivalent to the thermal expanding coefficient of the light-transmissive member 30 is preferable. With the use of such a kovar, warping of the light-transmissive member 30 and the holding member 90 can be reduced or prevented when the light-transmissive member 30 is bonded to the holding member 90 through thermal welding.

The holding member 90 can be formed in a flat-plate-like shape or a shape defining a recess in a cross-sectional view.

The holding member 90 may have a thickness, for example, in a range of 1 mm to 5 mm.

Other Component Members

Figure 3C:
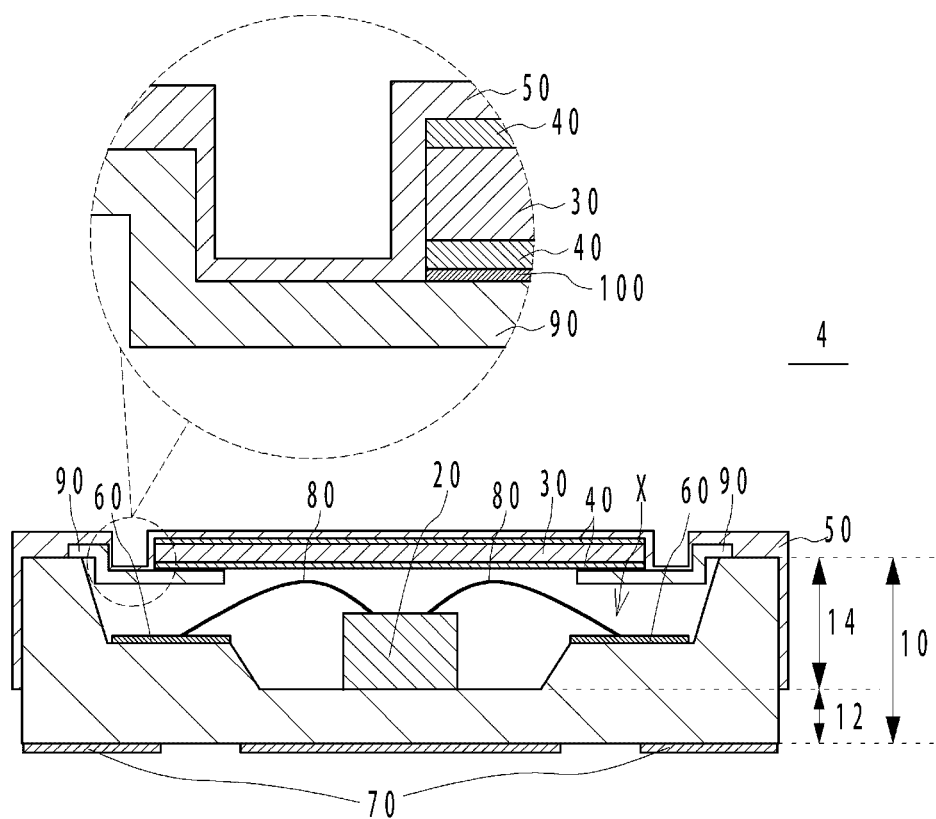
FIG. 3C is a schematic cross-sectional view illustrating another example of the coating film.

Description of other component members of the present embodiment that are the same or similar to those in the first embodiment will be appropriately omitted. The light-transmissive member 30 is disposed such that a portion of the lower surface of the light-transmissive member 30 is bonded to the upper surface of the holding member 90 to cover the opening of the holding member 90. The antireflection film 40 is disposed such that in regions where a portion of the lower surface of the light-transmissive member 30 is bonded to the upper surface of the holding member 90 via the antireflection film, the antireflection film 40 is present between the lower surface of the light-transmissive member 30 and the upper surface of the holding member 90. The coating film 50 is disposed to cover at least a portion of the outer surfaces of the light-emitting devices 1 to 4. At least portions of the outer surfaces of the light-emitting devices 1 to 4 covered by the coating film 50 include regions where the portions of the antireflection film 40 present between the lower surface of the light-transmissive member 30 and the upper surface of the holding member 90 are exposed. The coating film 50 may be disposed to cover a portion of the outer surfaces of the light-emitting device 3 as shown in FIG. 3B, but preferably disposed to cover substantially entire outer surfaces except for the lower surface of the light-emitting device 4 as shown in FIG. 3C. With this arrangement, the tendency of the coating film 50 separating from the outer surfaces of the light-emitting devices 1 to 4 can be reduced or prevented.

According to the second embodiment as described above, at least portions of the outer surfaces of the light-emitting device are covered by the coating film similar to that in the first embodiment, such that unintended substances contained in the environmental air can be reduced or prevented from entering the recess X of the package through the minute defects in the antireflection film. Accordingly, the light emitting device 2 of high reliability can be provided, in which separation of the light-transmissive member is reduced or prevented.

Method of Manufacturing Light Emitting Device 2 According to Second Embodiment

FIG. 4 is a schematic cross-sectional view illustrating a method of manufacturing a light emitting device according to the second embodiment.

Providing Light-Emitting Element Package 300

Figure 4A:
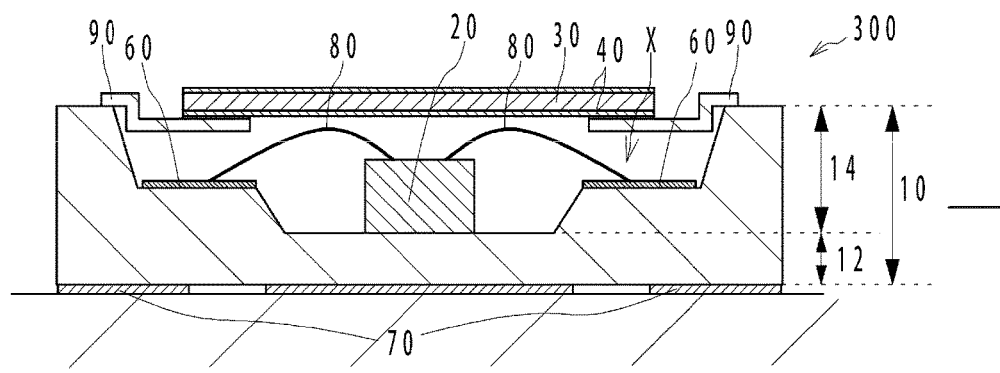
FIGS. 4(A) to 4(C) are schematic cross-sectional views illustrating a method of manufacturing a light emitting device according to the second embodiment.

As shown in FIG. 4A, a light-emitting element package 300 including a package 10 defining a recess X, a light-emitting element 20 disposed in the recess X, a holding member 90 defining an opening and disposed at an upper surface side of the package 10 and covering a portion of the recess X of the package 10, a light-transmissive member 30 having a lower surface, a portion of the lower surface of the light-transmissive member 30 being bonded to an upper surface of the holding member 90 and covering the opening of the holding member 90, and an antireflection film 40 disposed on a lower surface of the light-transmissive member 30 and in regions where portions of the lower surface of the light-transmissive member 30 are bonded on the upper surface of the holding member 90 via the antireflection film 40, the antireflection film 40 is present between the lower surface of the light-transmissive member 30 and the upper surface of the holding member 90. As in the first embodiment, the providing the light-emitting element package 300 may be performed by arranging the light-emitting element package 300 in a reaction chamber or the like, or by manufacturing the light-emitting element package 300 in a reaction chamber.

Providing Coating Film 50

Figure 4B:
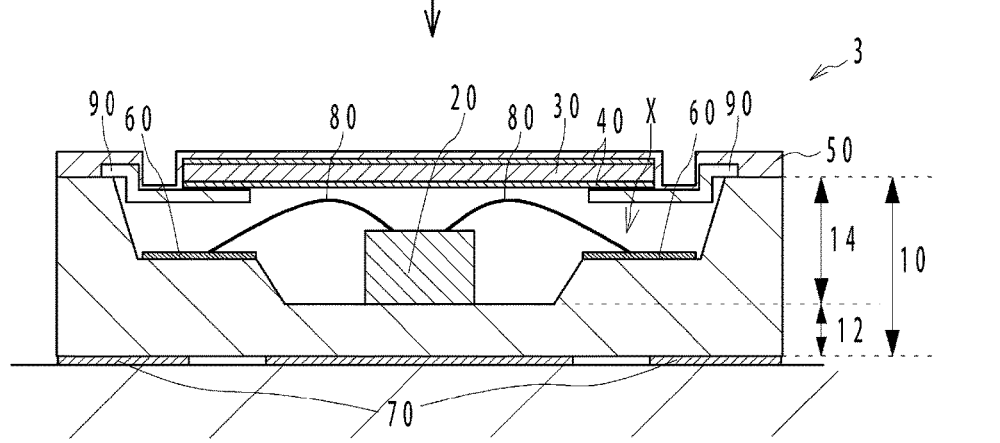
Figure 4C:
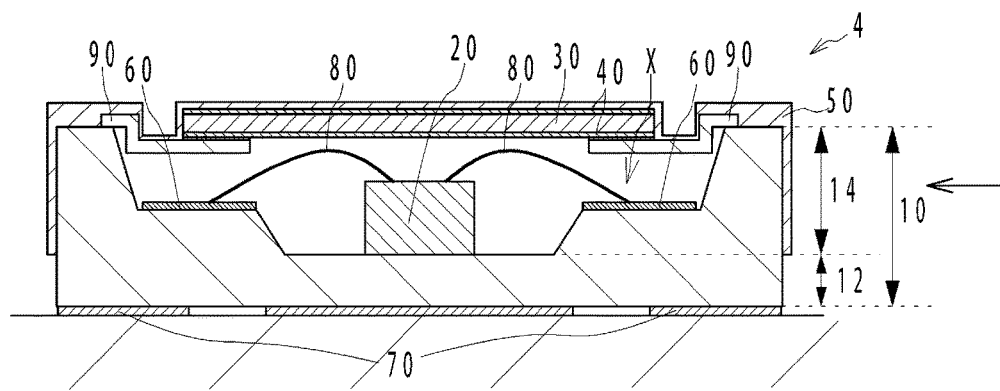

As shown in FIG. 4B, a coating film 50 is formed to cover at least a portion of the outer surfaces of the light-emitting element package 3, including the regions exposing the antireflection film 40 present between the lower surface of the light-transmissive member 30 and the upper surface of the holding member 90. The coating film 50 may be disposed to cover a portion of the outer surfaces of the light-emitting element package 300 as shown in FIG. 4B, but preferably disposed to cover substantially entire outer surfaces except for the lower surface of the light-emitting device 1 as shown in FIG. 4C. The reason of the coating film 50 not to be disposed on the lower surface of the light-emitting element package 300 is that the light-emitting element package 300 is placed on a base mount in the reaction chamber or the like with the lower surface of the light-emitting element package 300 being in contact with the base mount, as in the first embodiment. The method of disposing the coating film 50 is similar to those described in the first embodiment and therefore description thereof will be appropriately omitted.

With the method described above, the light-emitting device 2 according to the second embodiment can be manufactured easily. An example of the method of manufacturing the light-emitting device 2 according to the second embodiment has been illustrated above, but other appropriate methods may also be employed.

It is to be understood that although the present disclosure has been described with regard to preferred embodiments thereof, various other embodiments and variants may occur to those skilled in the art, which are within the scope and spirit of the invention, and such other embodiments and variants are intended to be covered by the following claims.

What is claimed is:

1. A method of manufacturing a light emitting device, the method comprising:
- providing a light-emitting element package, the light-emitting element package including
  - a package having an upward-opening recess,
  - at least one light-emitting element disposed in the recess,
  - a holding member defining an opening disposed at an upper surface side of the package and partially covering an opening of the recess,
  - a light-transmissive member covering the opening of the holding member, and
  - an antireflection film disposed on a lower surface of the light-transmissive member, the antireflection film located between the lower surface of the light-transmissive member and an upper surface of the package at a location where a portion of the lower surface of the light-transmissive member is bonded to the upper surface of the package via the antireflection film; and
- disposing a coating film on at least a portion of outer surfaces of the light-emitting element package, the portion including a region where the antireflection film located between the lower surface of the light-transmissive member and the upper surface of the holding member is exposed to environmental air.

2. The method of manufacturing a light emitting device according to claim 1, wherein in the disposing a coating film, the coating film is disposed using an atomic layer deposition method.

3. The method of manufacturing a light emitting device according to claim 1, wherein the antireflection film is a dielectric multilayer film.

4. The method of manufacturing a light emitting device according to claim 1, wherein the at least one light-emitting element has a peak emission wavelength in a range of 250 nm to 410 nm.

5. The method of manufacturing a light emitting device according to claim 1, wherein the at least one light-emitting element has a semiconductor layered structure containing a nitride semiconductor layer at least containing aluminum.

* * * * *